United States Patent [19]
Parker et al.

[11] Patent Number: 5,513,188
[45] Date of Patent: Apr. 30, 1996

[54] ENHANCED INTERCONNECT TESTING THROUGH UTILIZATION OF BOARD TOPOLOGY DATA

[75] Inventors: Kenneth P. Parker; Kenneth E. Posse, both of Fort Collins, Colo.

[73] Assignee: Hewlett-Packard Company, Palo Alto, Calif.

[21] Appl. No.: 208,245

[22] Filed: Mar. 9, 1994

Related U.S. Application Data

[63] Continuation-in-part of Ser. No. 794,767, Nov. 19, 1991, and a continuation-in-part of Ser. No. 201,741, Mar. 1, 1994, which is a continuation of Ser. No. 757,162, Sep. 10, 1991, abandoned.

[51] Int. Cl.$^6$ ................................................. H04B 17/00
[52] U.S. Cl. ........................................................ 371/22.3
[58] Field of Search ............................... 371/22.3, 22.1, 371/22.5, 27, 21.3; 324/158.1

[56] References Cited

U.S. PATENT DOCUMENTS

| | | | |
|---|---|---|---|
| 5,027,353 | 6/1991 | Jarwala et al. | 371/27 |
| 5,029,166 | 7/1991 | Jarwala et al. | 371/22.1 |
| 5,130,988 | 7/1992 | Wilcox et al. | 371/22.3 |
| 5,166,937 | 11/1992 | Blecha, Jr. | 371/22.5 |
| 5,172,377 | 12/1992 | Robinson et al. | 371/22.3 |
| 5,260,649 | 11/1993 | Parker et al. | 371/22.3 |

OTHER PUBLICATIONS

Cheng et al "Diagnosis for Wiring Interconnects" 1990 International Test Conf. IEEE pp. 565–571.
Cheng et al "Optimal Diagnostic Methods for Wiring Interconnects" 1992 IEEE Trans. on Computer Aided Design vol. II No. 9 Sep. 1992.
McBean et al "Testing Interconnects: A Pin Adiacency Approach" 1993 IEEE pp. 484–490.
Yau et al "A Unified Theory for Designing Optimal Test Generation and Diagnosis Algorithms for Board Interconnects" 1989 Int. Test Conference pp. 71–77.
McBean et al. "Bridging Fault Algorithms for a Boundary Scan Board" 1990 IEEE pp. 6-1-618.
Hansen, "Testing Conventional Logic And Memory Clusters Using Boundary Scan Devices As Virtual ATE Channels," 1989 International Test Conference, 1989 IEEE, Paper 7.1, pp. 166–173.
Hassan et al., "Testing And Diagnosis of Interconnects Using Boundary Scan Architecture," 1988 International Test Conference, 1988 IEEE, Paper 7.1, pp. 126–137.
Kashiwabara et al., "Permutation Layout with Arbitrary Between–pins Capacities," *1990 IEEE,* pp. 340–343.
Jarwala et al., "A New Framework for Analyzing Test Generation and Diagnosis Algorithms for Wiring Interconnects," 1989 International Test Conference, 1989 IEEE, Paper 3.3, pp. 63–70.
de Jong, "Boundary Scan Test Used At Board Level–Moving Towards Reality," 1990 International Test Conference, 1990 IEEE, Paper 9.2, pp. 235–242.

*Primary Examiner*—Robert W. Beausoliel, Jr.
*Assistant Examiner*—Joseph E. Palys

[57] ABSTRACT

A method for generating improved detection and diagnostic test patterns and for improving the diagnostic resolution of interconnect testing of a circuit is based on the premise that short-circuits are most likely to result from solder bridges between closely adjacent pins. In a first embodiment, an optimal boundary-scan test pattern is generated. In a second embodiment, boundary-scan test diagnosis is enhanced by utilizing x,y coordinate data corresponding to the physical location of devices on the tested circuit. In a third embodiment, diagnosis of unpowered short-circuit testing is enhanced.

20 Claims, 12 Drawing Sheets

FIG 4

Table 400 (402, 404):

| NET | ID VECTOR | | | | | | | |
|-----|---|---|---|---|---|---|---|---|
| n1 | 1 | 0 | 0 | 0 | 0 | 0 | 0 | 0 |
| n2 | 0 | 1 | 0 | 0 | 0 | 0 | 0 | 0 |
| n3 | 0 | 0 | 1 | 0 | 0 | 0 | 0 | 0 |
| n4 | 0 | 0 | 0 | 1 | 0 | 0 | 0 | 0 |
| n5 | 0 | 0 | 0 | 0 | 1 | 0 | 0 | 0 |
| n6 | 0 | 0 | 0 | 0 | 0 | 1 | 0 | 0 |
| n7 | 0 | 0 | 0 | 0 | 0 | 0 | 1 | 0 |
| n8 | 0 | 0 | 0 | 0 | 0 | 0 | 0 | 1 |

FIG 5

Table 500 (502, 504):

| NET | ID NUMBER | | | |
|-----|---|---|---|---|
| n1 | 0 | 0 | 0 | 1 |
| n2 | 0 | 0 | 1 | 0 |
| n3 | 0 | 0 | 1 | 1 |
| n4 | 0 | 1 | 0 | 0 |
| n5 | 0 | 1 | 0 | 1 |
| n6 | 0 | 1 | 1 | 0 |
| n7 | 0 | 1 | 1 | 1 |
| n8 | 1 | 0 | 0 | 0 |

| NET 1002 | NETS WITHIN GROUP 1004 | NET ID ASSIGNMENTS 1006 | GROUP 1008 |
|---|---|---|---|
| $n_1$ | $n_2$ | $n_1 = 0001, n_2 = 0010$ | A |
| $n_2$ | $n_1 n_3 n_4$ | $n_3 = 0100, n_4 = 1000$ | B |
| $n_3$ | $n_2 n_4 n_5$ | $n_5 = 0001$ | C |
| $n_4$ | $n_2 n_3$ | — | — |
| $n_5$ | $n_3$ | — | — |
| $n_6$ | $n_7 n_8$ | $n_6 = 0001, n_7 = 0010, n_8 = 0100$ | D |
| $n_7$ | $n_6 n_8$ | — | — |
| $n_8$ | $n_6 n_7$ | — | — |

*FIG 10*

ENHANCED INTERCONNECT TESTING THROUGH UTILIZATION OF BOARD TOPOLOGY DATA

BACKGROUND OF THE INVENTION

1. Related Applications

This application is a continuation-in-part of patent application Ser. No. 07/794,767, filed Nov. 19, 1991; and patent application Ser. No. 08/201,741, filed Mar. 1, 1994, which is a file wrapper continuation of patent application Ser. No. 07/757,162, filed, Sep. 10, 1991, now abandoned.

2. Field of the Invention

The present invention relates to the field of interconnect testing of circuit boards. More specifically, the invention relates to a method for generating detection and diagnostic test patterns for a boundary-scan interconnect test and for enhancing diagnostic resolution of boundary-scan and other interconnect tests after they have been executed.

3. Background Art

Testing complex digital circuitry at the circuit board level is frequently performed on an ATE (Automated Test Equipment) system. The HP3070 tester is an example of an ATE system. The HP3070 is available from Hewlett-Packard Company, Palo Alto, Calif. Detailed operational information for the HP3070 is contained in "HP3070 Board Test System User's Documentation Set (1989)" available from Hewlett-Packard under HP part number 44930A.

Testing performed on an ATE system includes functional test and in-circuit test. Functional test conventionally involves providing input signals to the external inputs of a circuit board and observing output signals from the external outputs of the board. This type of testing becomes quite complex for large circuits and can provide only limited diagnostics.

Modern testing increasingly supplements this traditional functional test with in-circuit component test. In-circuit component test is a type of functional test wherein the performance of each digital integrated circuit (IC) is tested as a functional unit. That is, each component (e.g., digital IC) on the board is tested as if it were electrically isolated from the surrounding circuit. In order to perform the in-circuit component test, the tester (e.g., ATE) must apply input signals directly to the inputs of a DUT (device under test) and must access the outputs of the DUT to observe the output response.

An ATE system, such as the HP3070, uses a "bed-of-nails" (i.e., probes which directly make contact with device I/O (input/output) pins from pads on the surface of the board) fixture to access the required nodes on a board. Unfortunately, the nodal access required by in-circuit test is often hampered by increasing circuit complexity (e.g., miniaturized components, multi-chip modules, ASIC's, etcetera) and increasing use of such technologies as surface mount and silicon-on-silicon.

The development of boundary-scan has facilitated in-circuit testing by improving nodal access. Boundary-scan is a standardized (e.g., IEEE Standard 1149.1-1990) test technique which involves devices designed with shift registers placed between each device pin and the internal logic of an IC chip. This provides a tester with access to every input and output signal on the boundary-scan chip, and allows the tester to control the I/O pins independent of the core logic and/or to control the core logic independent of the I/O pins.

For example, a boundary-scan IC chip 100 is shown in FIG. 1. A boundary register 102 is formed from a plurality of boundary register cells 104. Each cell 104 is disposed between an I/O terminal 106(a)–(b) and the internal logic 108 of chip 100. As a matter of convention, input terminals 106(a) are shown on the left-hand side of chip 100, and output terminals 106(b) are shown on the right-hand side of chip 100. Some of the I/O terminals may be bidirectional. Bidirectional pins, however, are fixed as either an input or an output for the interconnect test. Thus, for the purpose of depiction, bidirectional pins are shown on the left-hand side of chip 100 if acting as an input (receiver) and on the right-hand side of chip 100 if acting as an output (driver).

A scanpath or scanchain 110 is formed through boundary register 102. An IDCODE (i.e., identification) register 112, a bypass register 114, and an instruction register 116 are also included in chip 100. IDCODE register 112 provides identification data for chip 100. Bypass register 114 is a one-bit register which allows boundary register 102 to be bypassed. Instruction register 116 decodes instruction bits which are used to select test mode and also to control the operational mode of the chip during test.

A test access port (TAP) controller 118 is a state machine which controls boundary register 102. Five I/O terminals have been added to chip 100 to accommodate boundary-scan. These five terminals constitute the test access port (TAP). A TDI (test data in) terminal provides serial test data and instruction bits to scanpath 110. A TDO (test data out) terminal provides serial output for scanpath 110. A TCK (test clock) terminal provides an independent test clock to chip 100. A TMS (test mode select) terminal provides the logic levels needed to change the state of TAP controller 118. A TRST (test rest) terminal is used to reset chip 100. The TRST terminal, shown in phantom, is optional.

A more detailed discussion on boundary-scan is provided in IEEE Std 1149.1-1990, "IEEE Standard Test Access Port and Boundary-Scan Architecture," IEEE Standards Board and "HP Boundary-Scan Tutorial and BSDL Reference Guide," Hewlett-Packard Company, HP part number E1017-90001, which are incorporated herein by reference.

Most relevant to the present invention is the use of boundary-scan for interconnect testing. In production testing of boards, device interconnects (e.g., printed circuit traces) are tested prior to mounting components thereon. Likewise, the components are tested prior to mounting on the board. Once the components are mounted on the board, it is desirable to re-test the interconnects. This test is called a boundary-scan interconnect test.

The boundary-scan interconnect test seeks to locate problems which are introduced during installation of the integrated circuit chips (IC's) on the circuit board. The primary faults include opens, shorts, missing or wrong components, and mis-oriented (e.g., rotated 180°) components. Opens frequently result from broken pins or "cold" solder joints. Shorts may be caused by excess solder bridging the gap from one IC pin connection to the next.

An interconnect test involves testing each conductive "net" or "node" on the board to ensure that it connects the proper devices (e.g., input and/or output buffers of one or more IC chips). A "net" or "node" is defined as an equipotential surface formed by a physical conductor.

A sample circuit 200 to be tested is shown in FIG. 2. Circuit 200 includes six interconnected IC's U1–U6. Boundary register cells 104 are shown in each IC. Following convention, input cells are shown on the left-hand side of each IC, and output cells are shown on the right-hand side of each IC. Each pin of each IC is numbered consecutively from the lower left-hand corner and is referenced by that number along with the IC reference number. For example, U1-3 refers to pin 3 of U1.

A scanpath 110 is shown connecting register cells 104 of IC's U1–U6. Cells 104 in scanpath 110 form the boundary register (102 in FIG. 1). A net $n_1$ connects U1-4 to U4-3. A net $n_2$ connects U1-5 to U4-2 and U5-4. A net $n_3$ connects U1-6 and U2-5 to U5-2. A net $n_4$ connects U2-4 to U4-1 and U5-3. A net $n_5$ connects U2-6 to U5-1. A net $n_6$ connects U3-4 to U6-3. A net $n_7$ connects U3-5 to U6-1. A net $n_8$ connects U3-6 to U6-2. The method of boundary-scan interconnect testing circuit 200 is shown in FIG. 3. At step 302, a test vector (i.e., test data) is serially shifted into boundary register 102. At step 304, the test vector is broadcast from appropriate output buffers (drivers) over the corresponding nets to receiving input buffers. The broadcast data is then captured into the receiving register cells at step 306. The captured test data is shifted out of boundary register 102 at step 308. Finally, the captured test data is compared to the broadcast test data at step 310. Differences in the captured and broadcast data indicate a fault. Because the captured test data contains information on the condition of the net over which it was broadcast, it is also called a "net signature" herein.

A single test vector can detect a fault; however, it provides very little diagnostic information. Therefore, in order to diagnose a fault condition, a plurality of test vectors are required. After the plurality of test vectors have been broadcast and captured, the captured data is analyzed for fault diagnosis.

Note that net $n_3$ is driven by two drivers (U1-6 and U2-5 in FIG. 2). An optimal test method will not test both of these drivers during boundary-scan test because it is inefficient and unnecessarily complicates the boundary-scan test. Instead, one driver is selected and designated for use in the interconnect test. The other driver will be added to a list of non-designated drivers. At completion of the interconnect test, the non-designated drivers will be tested during a bus test (i.e., a test to verify connection only since testing for short circuits has already been performed by the boundary-scan interconnect test). The bus test can be performed very quickly by testing all non-designated drivers in parallel.

Interconnect faults include single-net faults and multi-net faults. Single-net faults involve only one net and include stuck HIGH, stuck LOW and open faults. Multi-net faults are caused by shorts which connect two or more nets. Single-net faults are simple to detect and locate. Multi-net faults, however, can be difficult to diagnose. For example, two short-circuited nodes can "alias" (i.e., behave) identically to a third good node such that it is not possible to determine whether the third good node is also involved in the short-circuit. Similarly, it is possible for two short-circuits, each involving two or more nodes, to have the identical behavior such that it is not clear whether there is one large short-circuit or two independent short-circuits. This phenomenon is known as "confounding".

The actual outcome of a multi-net fault will depend on the type of nets involved. The three types of nets include: simple nets, wire nets, and three-state nets. A simple net is driven by a single buffer/driver. A wire net is a net which is driven by more than one buffer/driver. A wire net may be either a wire-AND or a wire-OR net. A wire-AND net is a net having drivers which have a dominant LOW state. That is, if two drivers are shorted together, a LOW signal will dominate such that a logical AND of the signals results. A wire-OR net is a net having drivers which have a dominant HIGH state. That is, if two drivers are shorted together, a HIGH signal will dominate such that a logical OR of the signals results. A three-state net is a net which is driven by more than one three-state buffer/driver.

The result of multi-net faults may be deterministic (predictable) or non-deterministic (non-predictable). Deterministic faults include OR-type shorts (i.e., shorts between wire-OR nets), AND-type shorts (i.e., shorts between wire-AND nets), and strong-driver shorts (i.e., a short between nets wherein a dominant driver controls the state of the nets regardless of other drivers). For a more detailed analysis of fault diagnosis, see N. Jarwala and C. W. Yau, "A New Framework for Analyzing Test Generation and Diagnosis Algorithms for Wiring Interconnects," *Proceedings of International Test Conference* 1989, pp. 63–70 (IEEE Order No. CH 2742-5/0000/0063), which is incorporated herein by reference.

In performing the interconnect boundary-scan test, it is sought to use a test pattern which will detect a fault (i.e., an interconnect problem) and which will provide diagnostic information useful for locating the fault. In addition, it is desirable to keep the test pattern as short as possible because each test vector must be serially shifted into (and out of) the boundary register one bit each test clock (TCK) cycle.

Unfortunately, these goals are in conflict such that brevity is often sacrificed for diagnostic capability and visa versa. A test pattern which has brevity as its primary concern is called a brief test pattern. Brief test patterns tend to provide limited diagnostics. A test pattern which is primarily concerned with diagnostic capabilities is called a high diagnostic test pattern. High diagnostic test patterns tend to be lengthy.

Walking Bit Test Pattern

For example, the "walking bit" is a conventional test pattern which provides optimal diagnostic resolution. The walking bit pattern assigns a unique ID (identification) number to each net. Each ID number contains a single complementary bit (e.g., a logical HIGH or logical LOW) in a field of otherwise identical bits. The single complementary bit is in a different, unique bit position or column for each ID number. For example, a walking ones pattern has a single logical HIGH or "1" bit.

FIG. 4 shows a walking ones test pattern which could be used to test circuit 200. After a unique walking ones net ID number has been assigned to each net, a matrix 400 of test data results. The horizontal rows of the matrix contain the net ID numbers, while the vertical columns contain the test frames or test vectors to be broadcast. A sample net ID number 402 which has been assigned to net $n_1$ and a test vector 404 are indicated.

Note that each test vector contains a single "1" according to the walking ones test pattern. Thus, only a single "1" will be broadcast in each test vector and on each net during the test. Since only a single "1" is used in each test vector, it is straightforward to identify which nets are shorted together and which nets are open. Thus, very good diagnostic resolution is available.

A principal failing of the walking bit test is that it is large (i.e., requires a large amount of tester memory), lengthy, and can become unmanageable for large circuits. The number of test clock (TCK) cycles required for the walking bit pattern is a function of (e.g., proportional to) the number of test vectors times the number of test signals (bits) per vector or roughly the number of nets squared ($N^2$). This is only a rough estimate because in practice, place holder bits must be inserted into each test vector in order to properly align the significant test bits with the appropriate drivers in a scanpath that includes both driver and receiver register cells. For the eight net example given in FIG. 4, a complete test requires eight test vectors, each test vector being 36 bits long (one bit for each cell in the scanpath with eight significant test bits and 28 place holder bits). This equates to 8 times 36 or 288 test clock cycles. For a circuit having 5000 nets, the test length would be proportional (i.e., this estimation does not account for place holder bits) to $5000^2$ or 25 million test clock cycles.

Counting Test Pattern

An example of a brief test pattern is the counting test pattern. The counting test is an alternative to the walking bit pattern. The counting pattern assigns a unique ID number to each net. The net ID numbers are increased in binary counting fashion such that a logarithmic compression in the number of test vectors results.

The "modified" counting test pattern is equivalent to the counting test pattern except the ID numbers containing all zeros or all ones have been eliminated such that each ID number contains at least one '1' and at least one '0'. This modification allows stuck-at fault testing. Unless specified otherwise, counting test, as used herein, refers to both the counting test and the modified counting test.

A sample modified counting pattern for circuit 200 is shown in FIG. 5. A matrix 500 of test vectors is formed from the ID numbers. The horizontal rows of the matrix contain the net ID numbers, while the vertical columns contain the test flames or test vectors to be broadcast. A sample net ID number 502 assigned to net $n_1$ and a sample test vector 504 are indicated.

Note that matrix 500 contains only four test vectors rather than eight as the walking bit pattern requires. In general, the walking bit pattern requires N test vectors, where N is equal to the number of nets in the circuit. Contrast the counting pattern which requires only $\log_2(N)$ (rounded to the next highest integer) test vectors and the modified counting pattern which requires only $\log_2(N+2)$ (rounded to the next highest integer) test vectors. Note that the sum of two which is added to N for the modified counting pattern accounts for the fact that the modified counting pattern does not use the all ones or all zeros numbers. For the eight net example given in FIG. 5, a complete modified counting pattern test requires four test vectors, each test vector being 36 bits long (one bit for each cell in the scanpath with eight significant test bits and 28 place holder bits). This equates to 4 times 36 or 144 test clock cycles. For a circuit having 5000 nets, the test length would be proportional (i.e., this estimation does not account for place holder bits) to 13 times 5000 or 65,000 test clock cycles. This is a substantial savings in test resources over the walking bit test.

A disadvantage of the reduced number of test vectors is a corresponding decrease in the diagnostic resolution of the test. For example, a short between nets $n_1$ and $n_2$ with wire-OR nets will produce the ID number for $n_3$ such that it may not be possible to determine if $n_3$ is also shorted.

A need exists in the art for a test which will provide the detailed diagnostics of the walking bit test pattern with the speed and brevity of the counting test pattern.

Adaptive Test Pattern

The prior attempts discussed above have tried to eliminate aliasing and confounding solely during the test generation stage. Adaptive algorithm methods, on the other hand, attempt to remedy these problems during execution of the test. These methods typically use a brief test method (e.g., a counting sequence) to identify a small subset of bad nets. A high-diagnostic test method (e.g., a walking ones sequence) is then dynamically derived and executed on this subset of bad nets to provide detailed diagnostics. This adaptive approach, however, is time consuming and resource expensive.

A need remains in the industry for a testing scheme which is time and resource efficient and which eliminates the problems of aliasing and confounding from a interconnect testing.

SUMMARY OF THE INVENTION

The invention is a method for performing interconnect tests on a circuit board. Testing is simplified and diagnostic resolution enhanced using the premise that short-circuits are most likely to result from solder bridges between closely adjacent pins. It is assumed that nets which do not have proximate I/O pins are not susceptible to short-circuiting. I/O pin adjacency data may be obtained in the form of x,y coordinates for each pin from CAD/CAM (Computer Aided Design/Computer Aided Manufacturing) databases for the board. Alternatively, pin adjacency data may be inferred from pin numbers (i.e., it may be assumed that pins 1 and 2 of an IC chip are closely adjacent).

In a first embodiment, improved detection and diagnostic test patterns are generated for boundary-scan interconnect testing. The invention provides the detailed diagnostics of a high diagnostic test pattern with the speed and brevity of a brief test pattern. This is done by generating a custom test pattern for each circuit to be tested. Nets which have radially adjacent pins are grouped together. Each net in a group is then assigned a unique net ID number according to a high diagnostic test pattern. Nets which are common to more than one group receive only a single unique net ID number. Each group is assigned a unique group ID number according to a brief test pattern.

The group ID number is appended to each net ID number to form a unique net identifier for each net. The unique net identifiers are combined to form a matrix. Each row of the matrix is one of the unique net identifiers. Each column of the matrix is a unique test vector available for boundary scan testing.

In a second embodiment, diagnostic resolution of a boundary-scan interconnect test is improved after the test has been executed. After a test has been executed, the captured test vectors are analyzed to determine which nets have produced (i.e., captured) identical net signatures. Since each net was originally assigned a unique net ID number, a duplicated number indicates a fault. Nets with common signatures are grouped together. Each group of nets is analyzed to determine whether a short-circuit is likely to have occurred between any of the nets within the group. This is done based on proximity (radial adjacency). It is assumed that nets which do not have proximal I/O pins are not susceptible to short-circuiting. Conversely, nets in the same group which also have radially proximal I/O pins are likely to be shorted together at the radially adjacent pins. Thus, all nets within a group which have radially adjacent I/O pins are marked as likely short-circuited nets. Nets within a group which do not have radially adjacent I/O pins are probably not short-circuited together. The invention may be used to increase the diagnostic resolution of any boundary-scan interconnect test pattern.

In a third embodiment, diagnosis of unpowered short-circuit testing is enhanced. When a short-circuit is indicated by an unpowered short-circuit test, a database is checked to determine the most likely physical locations of the short-circuit. The probable locations include points where an I/O pin of one net is radially adjacent an I/O pin of the other net. These physical locations are provided to a test technician to expedite location of the fault.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 4 is a matrix of test vectors formed for the sample circuit according to a walking ones test pattern.

FIG. 5 is a matrix of test vectors formed for the sample circuit according to a modified counting test pattern.

FIG. 10 is a table illustrating generation of a test pattern according to the invention for circuit 200 of FIG. 2.

DESCRIPTION OF THE PREFERRED EMBODIMENT

The preferred embodiments of the invention are discussed in detail below with reference to the figures where like reference numbers indicate like elements. Also in the figures, the left most digits of each reference number corresponds to the figure in which the reference number is first used. While specific part numbers and/or configurations are discussed, it should be understood that this is done for illustration purposes only. A person skilled in the relevant art will recognize that other components and configurations may be used without parting from the spirit and scope of the invention.

Interconnects are tested extensively prior to mounting components on a circuit board. Therefore, if a short is to occur between nets, it is likely that the short will result from a solder bridge between closely adjacent I/O pins. The present invention keys on this concept in performing interconnect tests.

By analyzing physical layout or pin coordinate data for a board under test, device I/O pins of a net which are close enough to pins of other nets to be susceptible to short-circuits caused by the manufacturing/soldering process can be identified. The pin coordinate data is often in the form of x,y coordinates for each pin and can be obtained from CAD/CAM (Computer Aided Design/Computer Aided Manufacturing) databases for the board. Alternatively, when CAD/CAM data is not available, pin adjacency data may be inferred from pin numbers (i.e., it may be assumed that pins 1 and 2 of an IC chip are closely adjacent).

The dimensions of the board and IC pins and specifications from the soldering process used to attach the IC devices to the board are used to determine a radial distance r beyond which shorting is likely not to occur. Engineering judgment may be exercised to make an optimal determination for the specific circuit boards being tested. This predetermined radial distance is then used in conjunction with the interconnect list and the physical layout data for the board to determine which nets may potentially be shorted together. Device pins which are within this predetermined radial distance r are referred to herein as "radially adjacent pins" and nets having radially adjacent pins are referred to herein as "radially adjacent nets."

Figure 6:
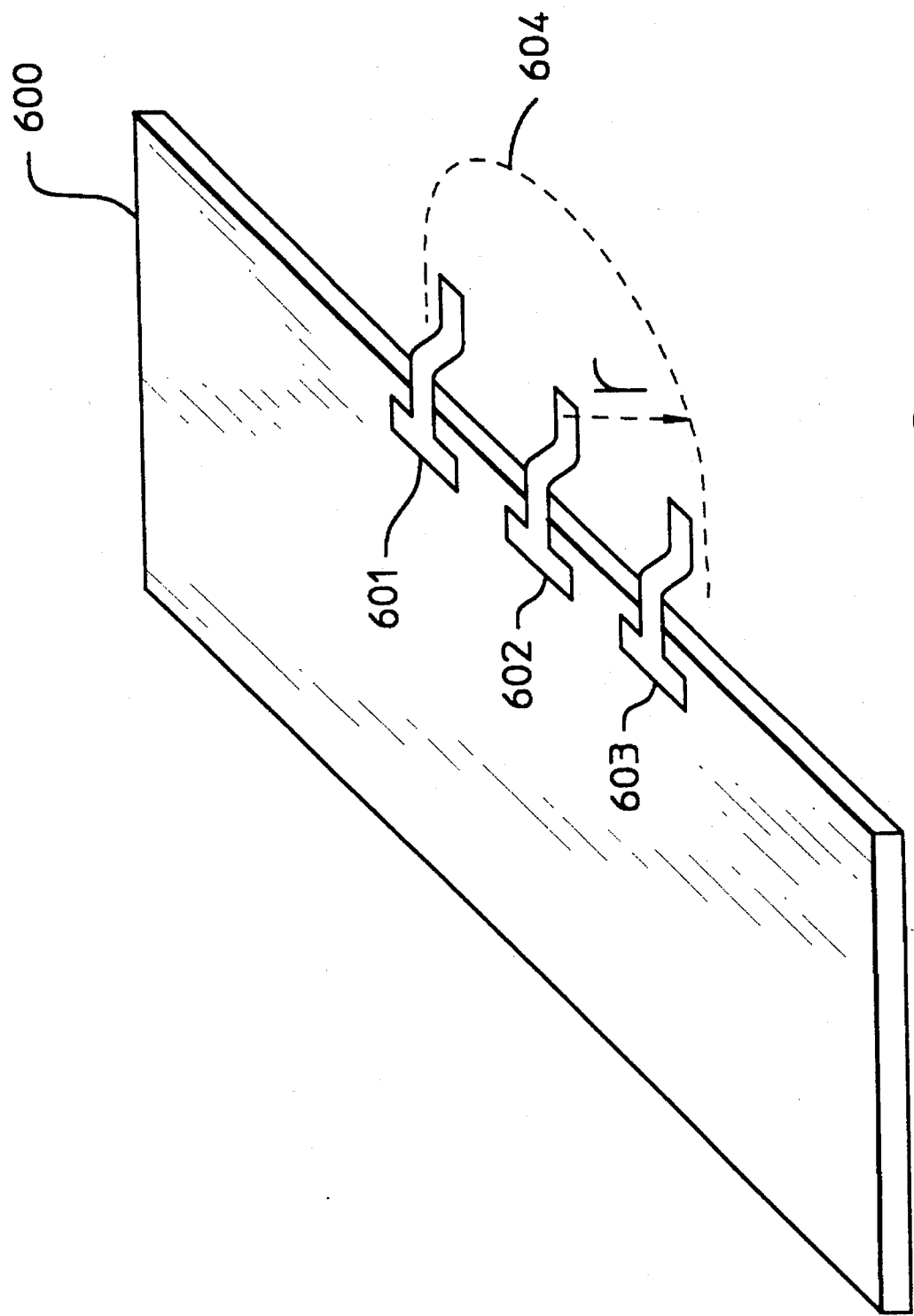
FIG. 6 is a partial block diagram of an IC chip illustrating the potential for short-circuits between radially adjacent pins.

This point is illustrated with reference to FIG. 6 which shows a sample integrated circuit chip (IC) 600. IC 600 includes input/output (I/O) pins 601–603. If pin 602 is selected and pins 601–603 are each connected to independent nets, then it is desirable to determine the susceptibility of pins 601 and 603 to shorting with pin 602. If it is determined that a solder bridge can potentially connect two pins at a radial distance r apart, then the technician/user will want to ensure that the shorting radius is set at least as large as this distance r. The tester may then use physical data for the board to determine if pins 601 and 603 are within a radial distance r to pin 602. Arc 604 is shown in FIG. 6 to illustrate that both pins 601 and 603 are within a radial distance r of pin 602. Thus, pins 601 and 603 are each radially adjacent to pin 602.

Figure 7:
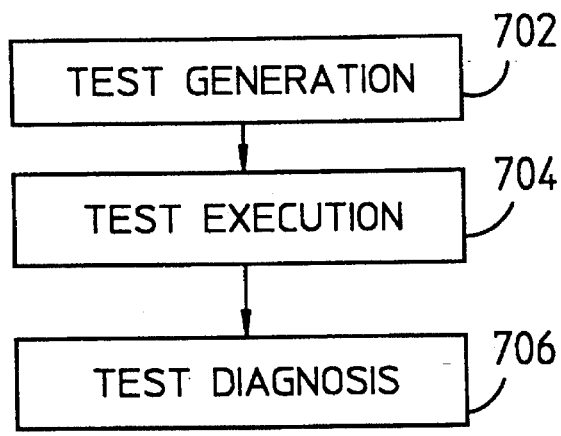
FIG. 7 is a flow chart providing an overview of the boundary-scan test method.

FIG. 7 shows the three steps involved in boundary-scan interconnect testing. First, at step 702, the test patterns (i.e., test vectors) are generated. Each net is assigned a unique ID number. At step 704, the test is executed on the circuit board via an ATE system. The test results are then analyzed for test diagnosis at step 706. Test diagnosis involves analyzing the test results to locate faults.

The present invention increases test resolution (i.e., reduces aliasing and confounding) at both the test generation and the test diagnosis stages. Each of these implementations is discussed in detail below.

Test Generation

Figure 8:
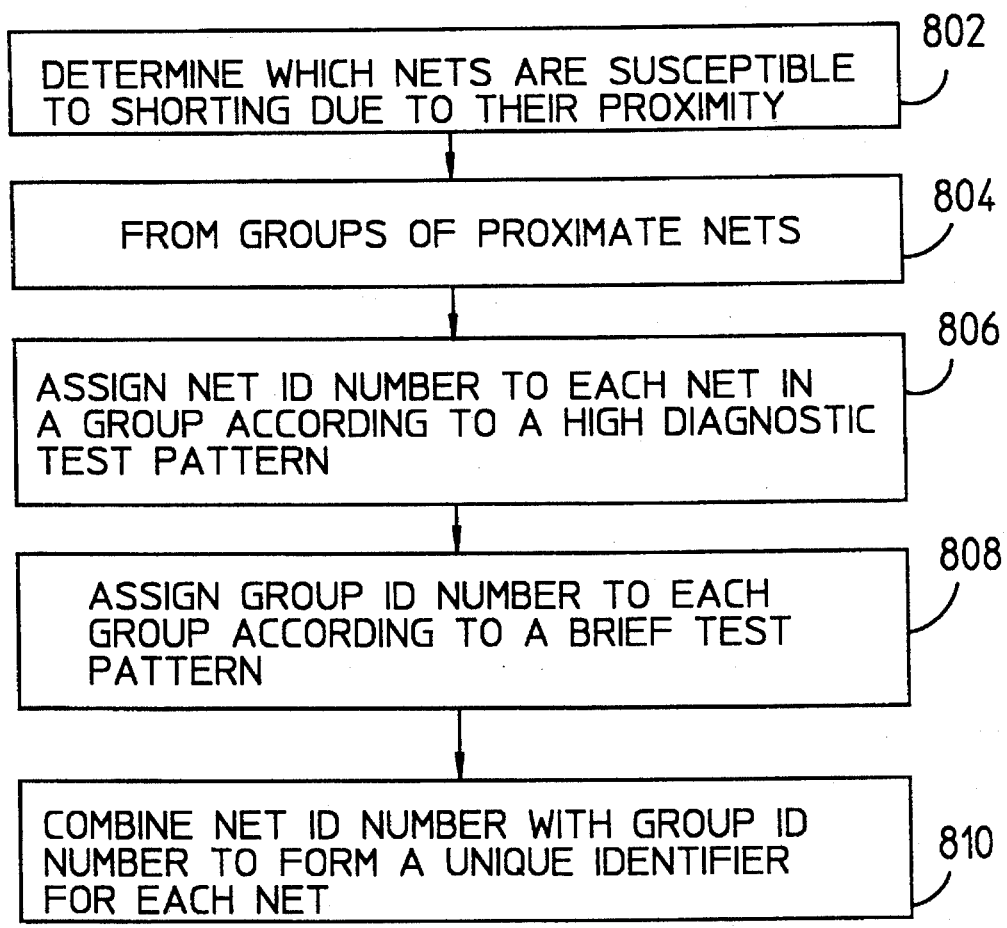
FIG. 8 is a flow chart providing an overview of the steps of the invention for generating a boundary-scan interconnect test.

FIG. 8 is a high level flow chart showing the steps of the invention. At step 802, the board under test is analyzed to determine which nets are susceptible to shorting to adjacent nets due to their physical proximity. This is accomplished by searching the nets for radially adjacent pins as described above. At step 804, all nets which have a pin which is radially adjacent to a pin of a selected net are arranged together into a group. This grouping is repeated for all nets. At step 806, a net ID number is assigned to each net within a group according to a high diagnostic test pattern (e.g., the walking bit test pattern). Each net within a particular group will have a unique net ID number with respect to the other nets within the group, however, net ID numbers are repeated between groups. That is, other groups may re-use the net ID numbers. Nets which are common to more than one group are assigned only one ID number.

At step 808, a group ID number is assigned to each group according to a brief test pattern (e.g., the counting pattern). Group ID numbers are unique for each group. At step 810, the net ID numbers and group ID numbers are combined to form a combined net identifier.

The group ID number and the net ID number may be joined together in any order, so long as consistency is maintained throughout the test. The group ID number is shown at the left-hand side of each net identifier in the examples provided below as a matter of arbitrary choice. This order may be reversed. Further, once the test vectors are formed, they may be applied to the circuit under test in any order.

It should be understood that the order in which the nets are selected for grouping will have a material affect on the outcome of the grouping. While it is acceptable to select the nets for grouping in any order (including random), some orders of grouping will produce better results than others. A method which produces a large number of small groups is preferred.

An example of a method which might be used to systematize grouping and minimize group size is to start grouping with nets located at the periphery of the board (on the assumption that nets near the edges of the board will have fewer radially adjacent nets such that small groups will be produced) and to then work around the periphery and in towards the center of the board until all nets have been grouped.

Note that since the invention has grouped together nets which theoretically are not susceptible to shorting with nets of other groups, it is possible to eliminate the group ID numbering scheme, if desired. The ramifications of doing this are that each net in the circuit no longer has a unique identifier assigned to it such that unforeseen errors (e.g., solder bridges greater than the expected size) may not be diagnosable.

Figure 9:
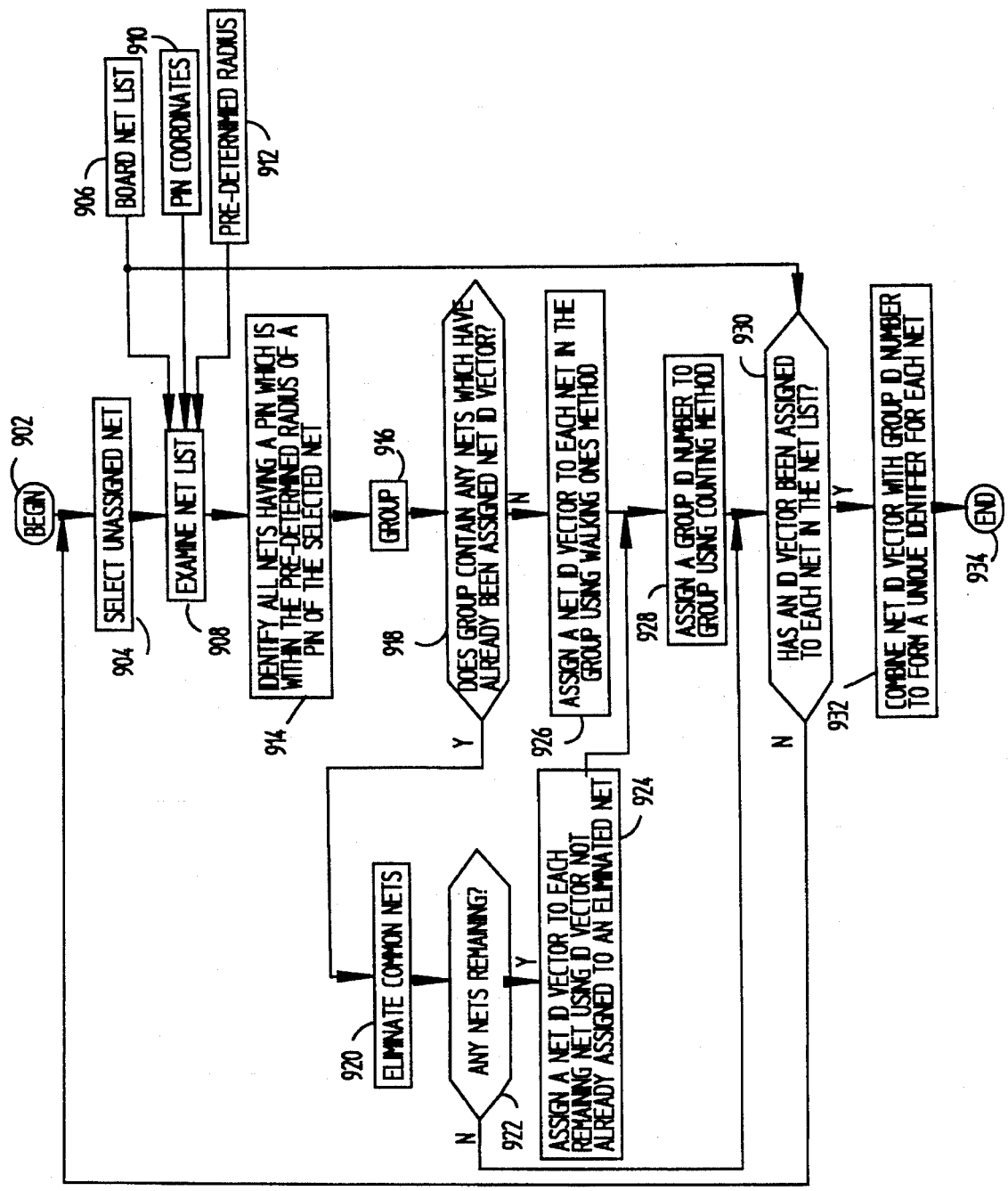
FIG. 9 is a flow chart detailing the steps of the invention for generating a boundary-scan interconnect test.

The method of the invention is now described in detail with reference to FIG. 9. In the preferred embodiment, the group ID numbering scheme is maintained. Also, the walking bit pattern is used for the high diagnostic test pattern and the counting pattern is used for the brief test pattern. Note that it is not necessary to use the modified counting pattern to generate the group ID numbers since at least one "1" and at least one "0" will appear in each completed identifier by virtue of the walking bit portion of the identifier.

The method begins at step 902. At step 904, a net which has not yet been assigned an ID number is selected for processing. A net list 906 for the board is then examined at step 908 in conjunction with pin coordinate data 910 and a predetermined radius (i.e., radial distance) 912. All nets which have a pin which is radially adjacent (i.e., within the predetermined radial distance) to a pin of the selected net are identified at step 914 and listed in a group 916.

At step 918, group 916 is checked to determine if any nets listed therein have already been assigned a net ID number by virtue of being listed in another group. If the group does contain nets which have already been assigned a net ID number, then these nets (which are common to another group) are eliminated from the present group at step 920. Note that although the common nets are eliminated from the group for test purposes; for test generation purposes, the net identifiers used in the group must be selected to be unique with respect to those used for the common nets (see step 924 below).

At step 922, the group is checked to determine whether any nets remain after step 920. If no nets remain in the group, then the group is a null group which is disregarded. If at least one net remains in the group, then each remaining net is assigned an ID number according to the walking bit pattern at step 924. Net ID numbers which were used to identify eliminated nets are not duplicated. The method then proceeds to step 928.

If, at step 918, group 916 does not contain nets which have already been assigned a net ID number, then each net is assigned a net ID number according to the walking bit pattern at step 926.

At step 928, the group is assigned a unique group ID number using the counting pattern. At step 930, net list 906 is checked to determine whether each net on the board has been assigned a net ID number. If not, then the method will return to step 904 where the next net is selected for processing. If all nets have been assigned a net ID number, then the net ID numbers and group ID numbers are combined at step 932 to form a unique net identifier for each net. The method then terminates at step 934.

Figure 1:
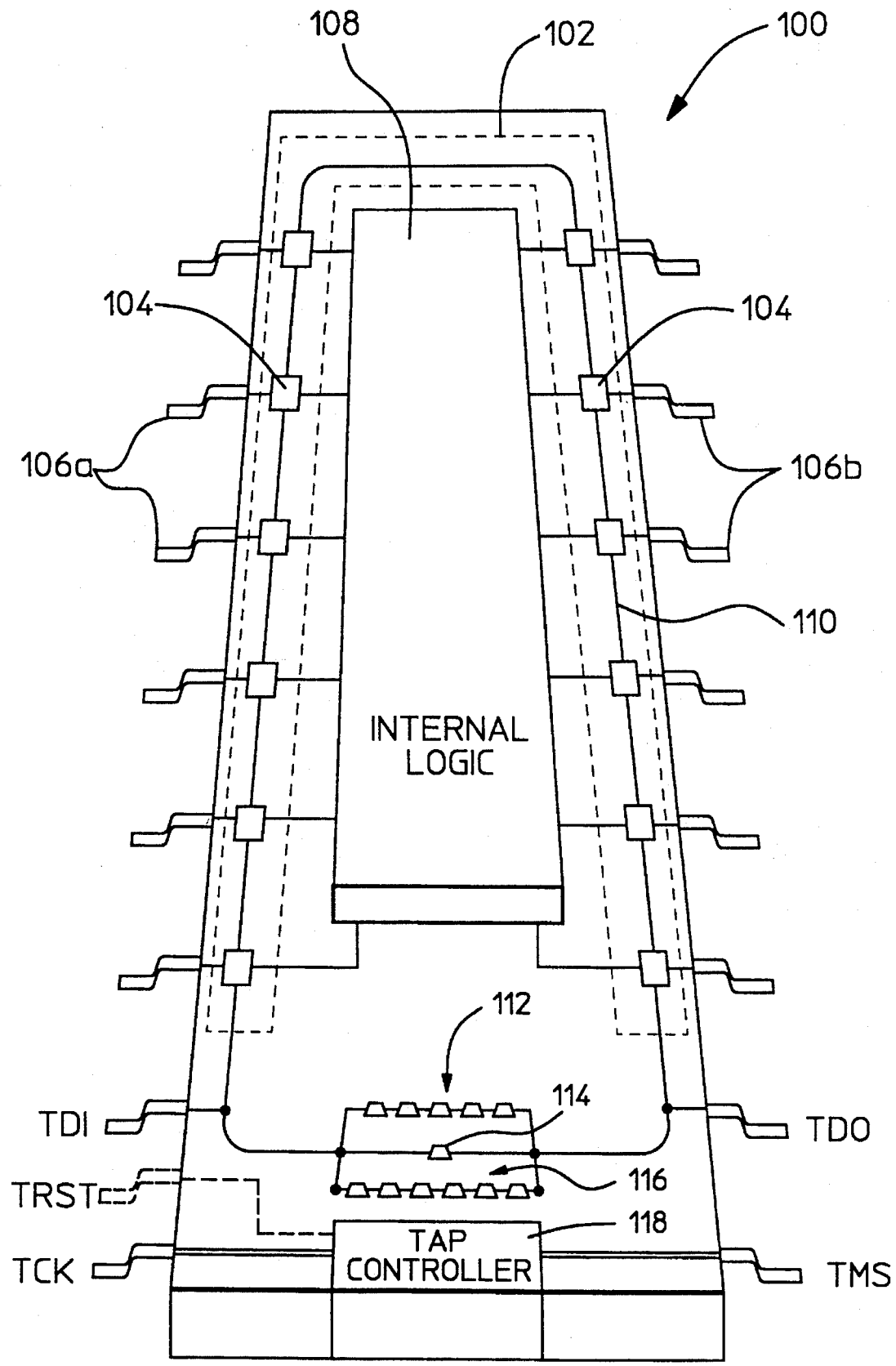
FIG. 1 is a diagram illustrating the structure of a typical boundary-scan device.
Figure 2:
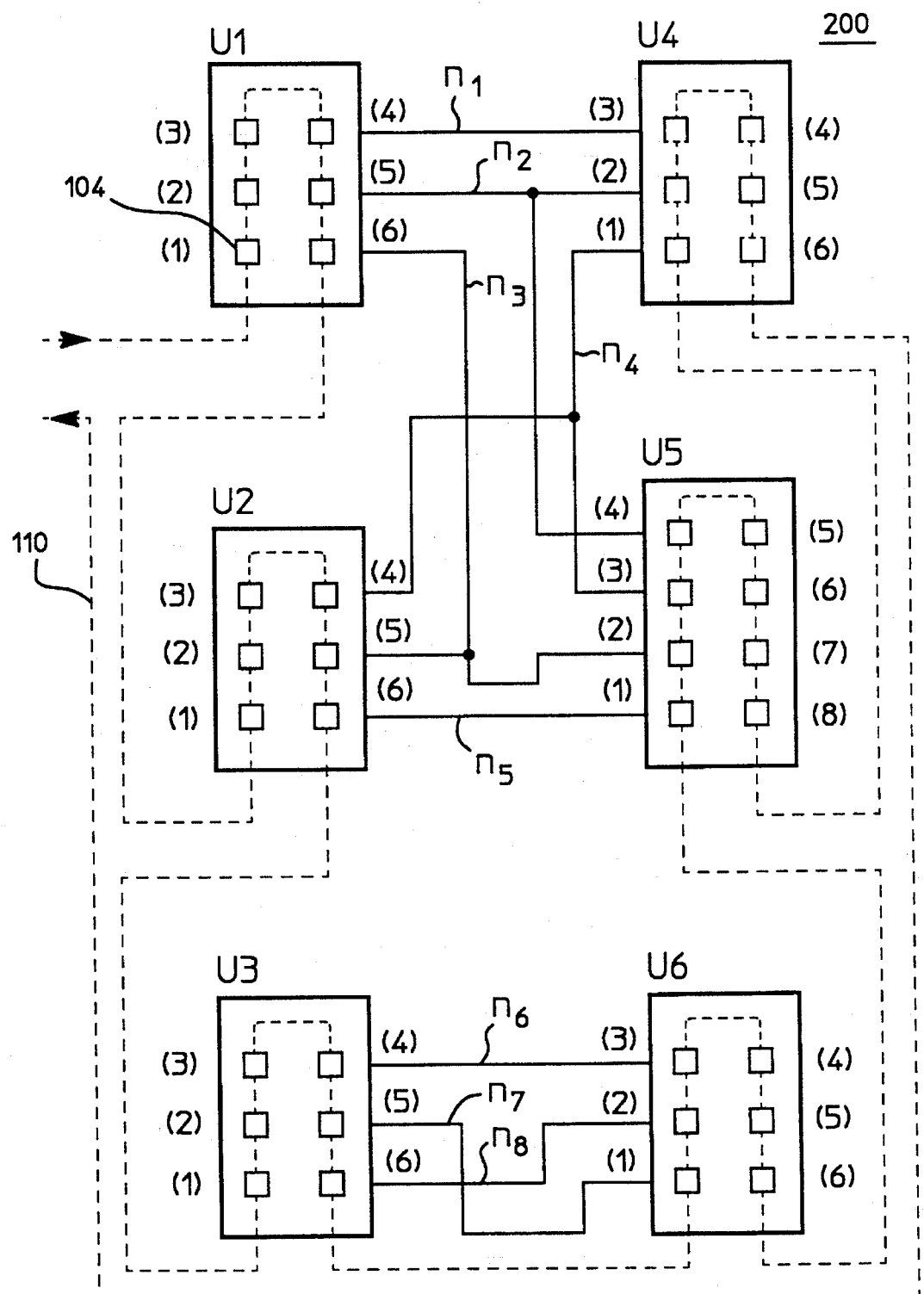
FIG. 2 is a schematic diagram of a sample circuit used to illustrate boundary-scan testing.

FIG. 10 is a table illustrating generation of a test pattern for circuit 200 of FIG. 2. For simplicity of grouping, it is assumed that the radial distance of shorting will encompass immediately adjacent pins of circuit 200 only. Column 1002 lists each net in circuit 200. Column 1004 lists the nets which are included in the corresponding group for each net after determining radial proximity (at step 914). Column 1006 lists the net ID number assignments for each net in the group.

The group corresponding to net $n_1$ includes nets $n_1$ (the selected net is included in its own group) and $n_2$. Note that a net ID number is assigned to both nets in the group. The group so formed is designated group A in column 1008.

The group corresponding to net $n_2$ includes nets $n_1$, $n_2$, $n_3$, and $n_4$. Net ID number assignments are made for nets $n_3$ and $n_4$ (step 924). Net ID number assignments, however, are not made for nets $n_1$ or $n_2$ because these nets are common to group A and have therefore already been assigned net ID numbers (see step 918 and 920). Note that the net ID numbers for nets $n_3$ and $n_4$ are unique with respect to the net ID numbers for common nets $n_1$ and $n_2$. The group formed by keying off of net $n_2$ is designated group B in column 1008.

The group corresponding to net $n_3$ includes nets $n_2$, $n_3$, $n_4$, and $n_5$. A net ID number assignment is made for net $n_5$ only (step 924). Net ID number assignments are not made for nets $n_2$, $n_3$, or $n_4$ because these nets are common to groups A and/or B and have therefore already been assigned net ID numbers (see step 918 and 920). Note again that the net ID number for net $n_5$ is unique with respect to the net ID numbers for common nets $n_2$, $n_3$, and $n_4$. The group formed by keying off of net $n_3$ is designated group C.

The group corresponding to net $n_4$ includes nets $n_2$, $n_3$, and $n_4$. Net ID number assignments are not made for any of these nets, however, because these nets are common to groups A, B, and/or C and have therefore already been assigned net ID numbers (see step 918 and 920). Thus, the group formed by keying off of net $n_4$ is a null group containing no members.

Similarly, the group corresponding to net $n_5$ includes nets $n_3$ and $n_5$, both of which are common to other groups. Thus, the group formed by keying off of net $n_5$ is also a null group containing no members.

The group corresponding to net $n_6$ includes nets $n_6$, $n_7$, and $n_8$. A net ID number assignment is made for each of these nets. The group formed thereby is designated group D.

The groups corresponding to nets $n_7$ and $n_8$ each include nets $n_6$, $n_7$, and $n_8$, all of which are common to group D. Thus, these groups are both null groups.

In sum, four groups (A, B, C and D) have been formed. The largest group prior to eliminating common members is group B which has four members. This largest group will dictate the number of bits (e.g., four) required for unique identification of the nets according to the walking bit pattern. The number of groups (not including null groups) is used to determine the number of bits required to uniquely identify each group according to the counting pattern. The number of bits required is equal to $\log_2$(number of groups) rounded to the next highest integer. For the example of FIG. 2, two bits would be required for unique group identification. The modified counting pattern, which may be used, would require three bits.

Figure 11:
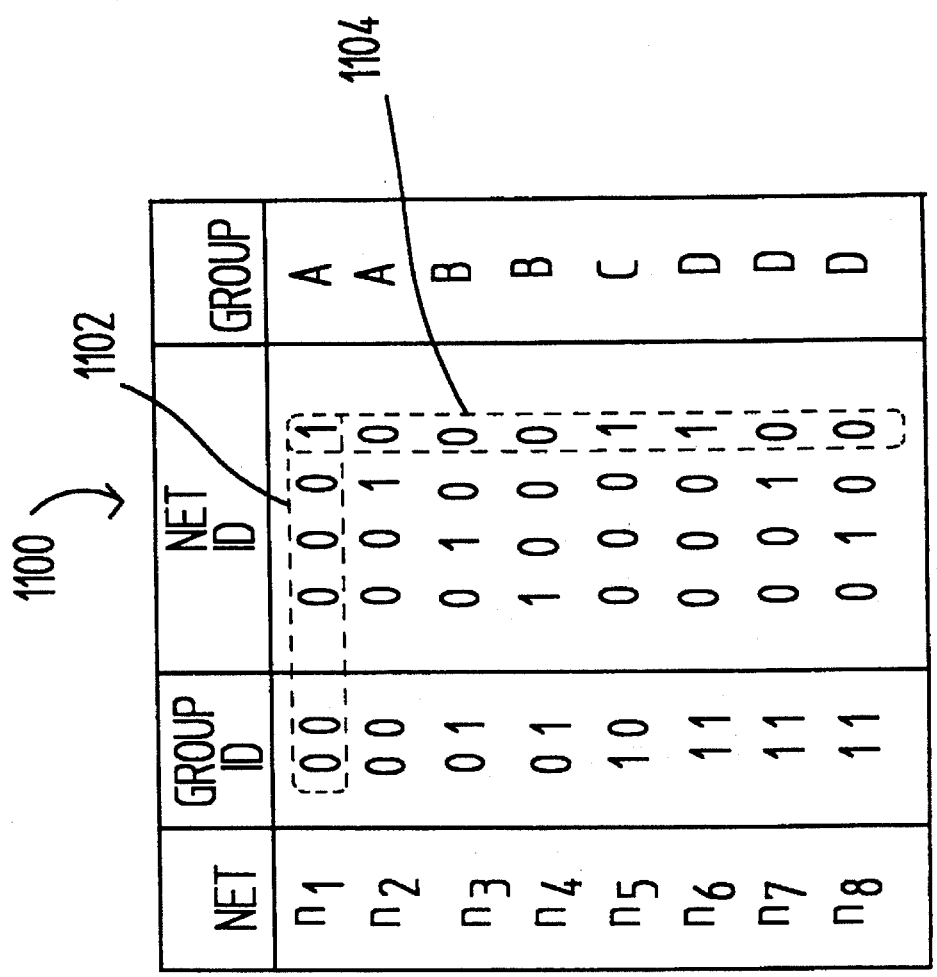
FIG. 11 is a matrix of test vectors formed for sample circuit 200 according to the present invention.

FIG. 11 shows the sample test pattern which results from the test generation discussed immediately above. Since the largest group contains four members, assignment of net ID numbers according to the walking bit pattern requires four bits. Since there are four groups, assignment of group ID numbers requires $\log_2(4)$ or two bits. Accordingly, six bits are required to generate each unique net identifier.

A matrix 1100 is formed from the compilation of the net identifiers. The horizontal rows of the matrix contain the net identifier for each net, while the vertical columns contain the test frames or test vectors to be broadcast. A sample net identifier 1102 and a sample test vector 1104 are indicated.

Note that each net is identified by a walking bit pattern with respect to adjacent or proximately located nets and by a counting pattern with respect to other nets. In this manner, a test pattern is generated which provides very good diagnostic information while minimizing length. Note that six test frames each having six bits have been generated for circuit 200. A test length proportional to 36 test clock cycles results. This is a substantial saving in test resources over the walking bit pattern.

A circuit having 5000 nets, might typically have 1250 groups (e.g., nets/4) with a largest group of 20 nets. This would result in an identifier size of $20+\log_2(1250)$ (rounded to the nearest whole number)=31 bits. The total test length would then be proportional (i.e., this estimation does not account for place holder bits) to 5000 nets times 31 bits or 155,000 test clock cycles. This is a substantial savings in test resources as compared with the minimum 25 million test clock cycles required by the conventional walking bit pattern. It is a greater number of test clock cycles than the minimum 65,000 required for the counting pattern, but with better diagnostics.

Figure 3:
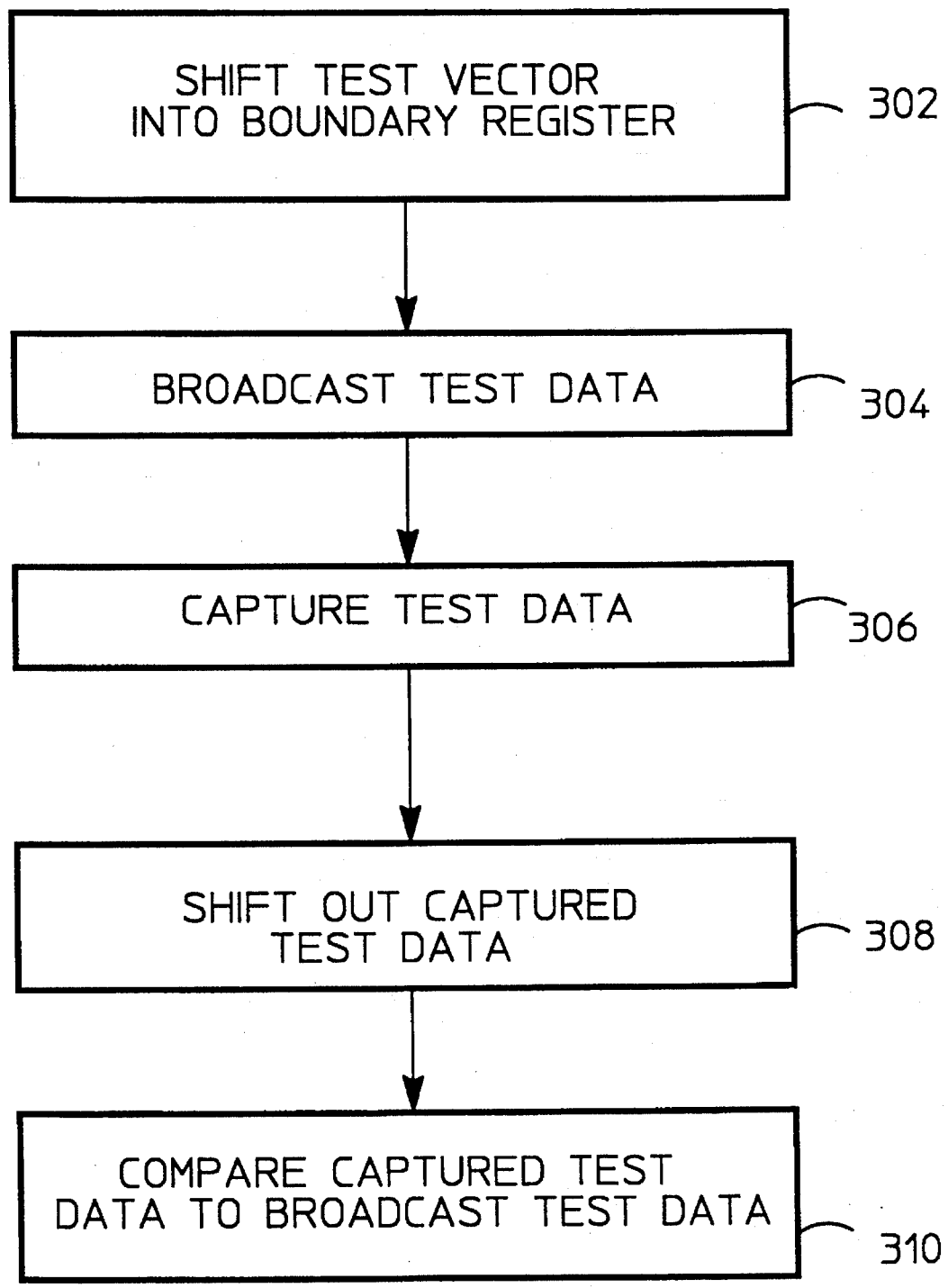
FIG. 3 is a flow chart showing the steps involved in performing a boundary-scan test.

Once the test vectors have been generated by the method of the invention, then these vectors can be applied to a circuit under test according to the conventional method. That method is described above with reference to FIG. 3.

Test Diagnosis

As discussed above, conventional test methods attempt to improve test resolution (i.e., a reduction of aliasing and confounding) at the test generation phase (step 702 in FIG. 7). Indeed, the method set forth above results in vast improvement in test resolution at the test generation phase. In addition to this method of test generation presented above, the inventors have discovered that the test diagnosis phase (step 706) provides an excellent opportunity to increase test resolution. Further, this increase in test resolution may be used without regard to the type of test pattern generated at step 702 and executed at step 704.

In the preferred embodiment, test diagnosis (step 706) is only performed if an error occurred during test execution. During execution of the test at step 704, the captured test vectors, which are scanned out of the circuit via the scanpath, are input to an accumulator or signature generator (e.g., a parallel input polynomial signature analyzer) to produce a unique test signature. This "test signature" should not be confused with the "net signature" (introduced above), which is indicative of the condition of a single net. The test signature is produced by logically combining a series of bits in such a manner that statistically there is a very high probability that the logical combination will produce a unique test signature or end product. Since each data term input to the signature generator will affect the unique test signature, comparison with a predetermined, expected signature will indicate whether any data errors have occurred.

Figure 12:
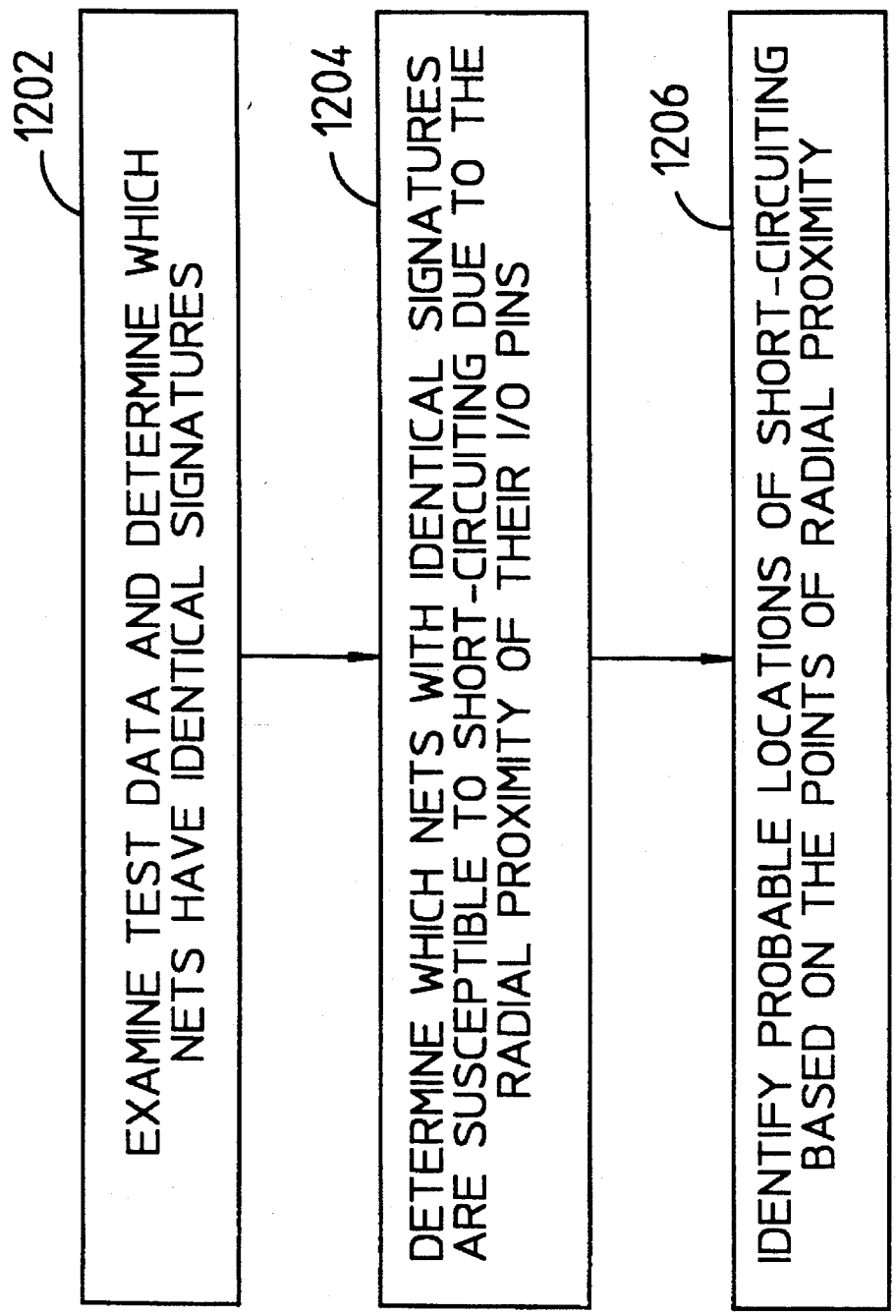
FIG. 12 is a high level flow chart providing an overview of the steps of the invention for improving the diagnostic resolution of a boundary-scan test.

FIG. 12 is a high-level flow chart illustrating the diagnostic method of the invention. In the preferred embodiment, this diagnostic method is performed only if a fault is indicated by the test signature as discussed above. At step 1202, the test data (captured test vectors) is analyzed to determine which nets have produced (i.e., captured) identical net signatures. Each net signature is made up of the captured bits which were received at a receiving register cell of the net as a result of transmitting a unique net ID number. A successful net signature will be identical to the unique net ID number. A failure net signature will not match the transmitted net ID number.

Since each net was originally assigned a unique net ID number, a duplicated number indicates a fault. Thus, step 1202 searches the captured test data to locate duplicated net signatures. At step 1204, each group of nets which have a common net signature is analyzed to determine whether a short-circuit is likely to have occurred between any of the nets within a group. The diagnostic method of the invention assumes that a short-circuit will only occur between radially adjacent nets.

Figure 13:
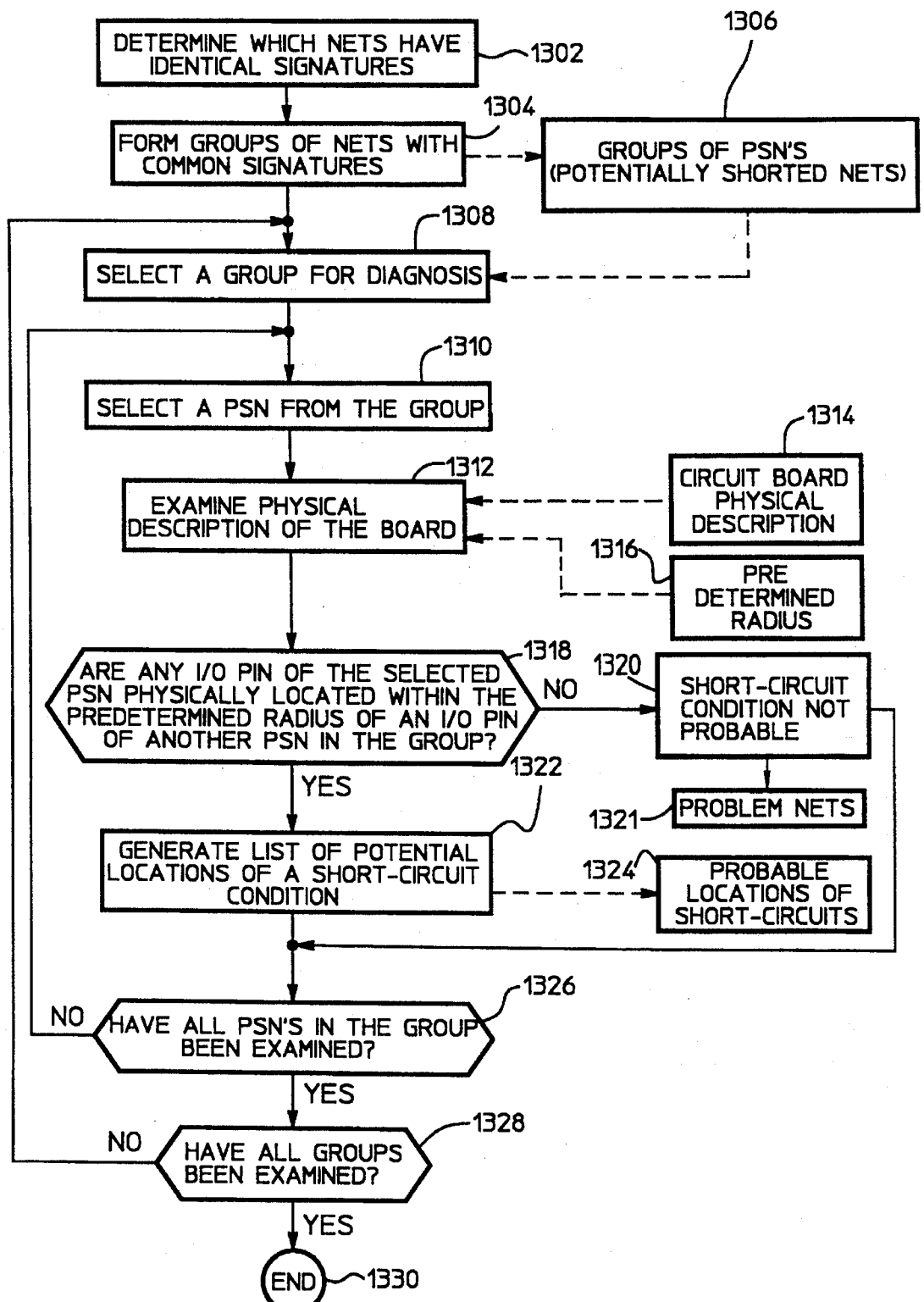
FIG. 13 is a flow chart detailing the steps of the invention for improving the diagnostic resolution of a boundary-scan test.

FIG. 13 is a detailed flow diagram illustrating the diagnostic method of the invention. At step 1302 the net signatures are analyzed to determine which nets have common net signatures. Each net having a common signature is then grouped with the nets which share the signature at step 1304. Each net in a group 1306 is called a PSN (potentially shorted net) since it is possible that the common signature indicates a short-circuit condition.

A group is selected for diagnosis at step 1308, and a particular PSN of the selected group is then selected at step 1310. At steps 1312 and 1318, the physical description of the board is analyzed (step 1312) to determine (step 1318) whether any I/O pins of the selected PSN are radially adjacent to any I/O pins of any other net in the selected group. In order to make this determination, the circuit board physical description 1314 and the predetermined radius 1316 are used.

Circuit board physical description 1314 provides a complete topological description of the circuit board. This is an enormous amount of data which would require a large amount of test time to sift through in order to glean out the desired I/O pin interconnect and location data. Thus, in order to improve the efficiency of the method, an adjacency list is generated from physical description 1314. The adjacency list includes a list of the nets on the board and, for each net, the radially adjacent nets. The adjacency list further has information on which I/O pins of the nets are radially adjacent. Thus, in the preferred embodiment, physical description 1314 is an adjacency list rather than a full topological description of the circuit board.

If there are no PSN's radially adjacent to the selected PSN (step 1318), then a short-circuit condition involving the selected PSN is not probable (step 1320). While a short circuit is not probable, the net has some problem which caused it to have an incorrect signature. Thus, the net is added to a list 1321 of problem nets. The method then proceeds to step 1326.

If there are radially adjacent PSN's, then a list 1324 of probable locations of short-circuits is generated at step 1322. The list of probable short-circuit locations includes the radially adjacent I/O pins of the PSN's. If, at step 1326, all PSN's in the selected group have been examined, then the method proceeds to step 1328. If, at step 1326, all PSN's in the selected group have not been examined, then the method returns to step 1310 where steps 1310–1326 are repeated for each PSN in the group.

To improve the efficiency of the method, each PSN which is examined at steps 1310–1326 is thereafter removed from further consideration in the group such that it is not re-checked at step 1318 when a next PSN is selected. This is done because a short circuit is reflexive (i.e., net A shorted to net B necessarily implies that net B is shorted to net A).

At step 1328, it is determined whether all groups of PSN's have been examined for probable short-circuits. If not, then the method returns to step 1308 and steps 1308–1328 are repeated for the next group of PSN's. If all groups have been examined, then the method ends at step 1330.

Two lists are produced by the method of the invention: list 1321 and list 1324. List 1321 contains the PSN's which are problem nets but are probably not short-circuited at their I/O pins. List 1324 contains each PSN which is short-circuited (probably) and the PSN's to which the short-circuit(s) extend. It may also include the actual I/O pins involved.

This method allows the diagnostic resolution of a test to be increased after the test is run. For example, if nets A and B have the same net signature, then the method will determine whether it is possible for A and B to be short-circuited by examining the adjacency list. Similarly, if nets A, B, C and D all have the same net signature, then this method can determine whether one large short-circuit including A-D exists, or whether two smaller short-circuits (e.g., A-B and C-D) exist.

This method does not provide perfect diagnosis and may still be "fooled". For example, if nets A and B short-circuit together to produce a net signature equivalent to that of net C, and if net C is radially adjacent to either of nets A and B, then it is not possible for the method to determine whether C is also short-circuited. The probability of this occurring, however, is quite low. For example, if the net ID numbers are assigned at random, then the probability of A and B producing the net signature of C is $1/(N-1)$, where N is the number of nets in the circuit. For a circuit having 1000 nets, this probability is only a fraction of a percent.

If the net ID numbers are assigned by an ordered method (e.g., the Enhanced Test Pattern discussed above) such that the probable combinations will not match nearby net signatures, then the enhancement in resolution (reduction in aliasing and confounding) may be increased by 100-fold or even 1000-fold while still using an optimal length counting sequence.

The computational work involved in this diagnostic method is minimal, especially if physical description 1314 is an adjacency list (as discussed above) rather than a full topological description of the circuit board. In addition, the adjacency list need only be generated once for each circuit board type.

The method of the invention is quite flexible. The shorting radius is easily adjusted to conform to the requirements of different soldering processes, board layouts, etc. If the shorting radius is altered, however, the adjacency list (if used) must be re-created.

In the preferred embodiment, a modified counting test pattern is used with the invention. For example, for a board having between 8 and 15 nets, an ID number containing nine bits could be used. The first four bit section is a binary counting number. The second section is a three bit section which is the complement of the three least significant bits of the four bit section. The final two bits include a first bit which is always a "1" and a second bit which is always a "0". This modified counting pattern provides a significant initial reduction in aliasing while maintaining a relatively short test.

The embodiments of the invention described above are directed primarily to boundary-scan or powered interconnect test. The invention, however, has utility and application in other types of testing. For example, the invention may be used to simplify diagnosis of unpowered interconnect or short-circuit testing.

An unpowered short-circuit test is a type of interconnect test performed before application of power to the components on the circuit board. Each net which can be accessed by a test probe of the ATE is tested to assure that it remains electrically isolated from adjacent nets. It is an object of this test to locate short-circuits between any nets to which the tester has access. Because power is not applied to the circuit board during execution of this test, the potential for damaging a component is substantially reduced. Thus, it is desirable to test as many nets as possible in this manner.

Conventionally, the unpowered short-circuit test has been performed by contacting each of the n nets on the circuit board with a test probe. A voltage is then applied to a selected net while all other nets are grounded. The applied voltage is selected to have a magnitude (e.g., 0.1 Volts) insufficient to turn on the semiconductor junctions of the components on the circuit board. The current flowing from the probe corresponding to the selected net is monitored to determine whether a short-circuit condition exists between the nets being tested. If the current does not exceed the threshold value, then no short-circuit is indicated for the selected net, and the selected net is eliminated from the set of n nets being tested. The test then repeats for a next selected net out of the n−1 remaining nets. The test continues until all tester accessible nets have been tested in this manner.

If the current does exceed the threshold value for a selected net, then a short-circuit condition is indicated. The short-circuit is located using an isolation technique. For example, the selected net may be powered while each remaining net is grounded one at a time until the shorted net is located. As a more efficient alternative, a binary chop isolation technique may be used. This involves grounding only one-half of the nets and checking the current at the selected net. If the current exceeds the threshold, then the grounded nets are again halved and the process repeats until the short-circuited net or nets have been identified.

For circuit boards having a large number of nets, conventional isolation techniques can be time and resource intensive. Moreover, once shorted nets have been identified, the problem remains of finding the specific location of the short circuit between the nets. This is normally performed by a test technician equipped with a circuit board layout print.

Figure 14:
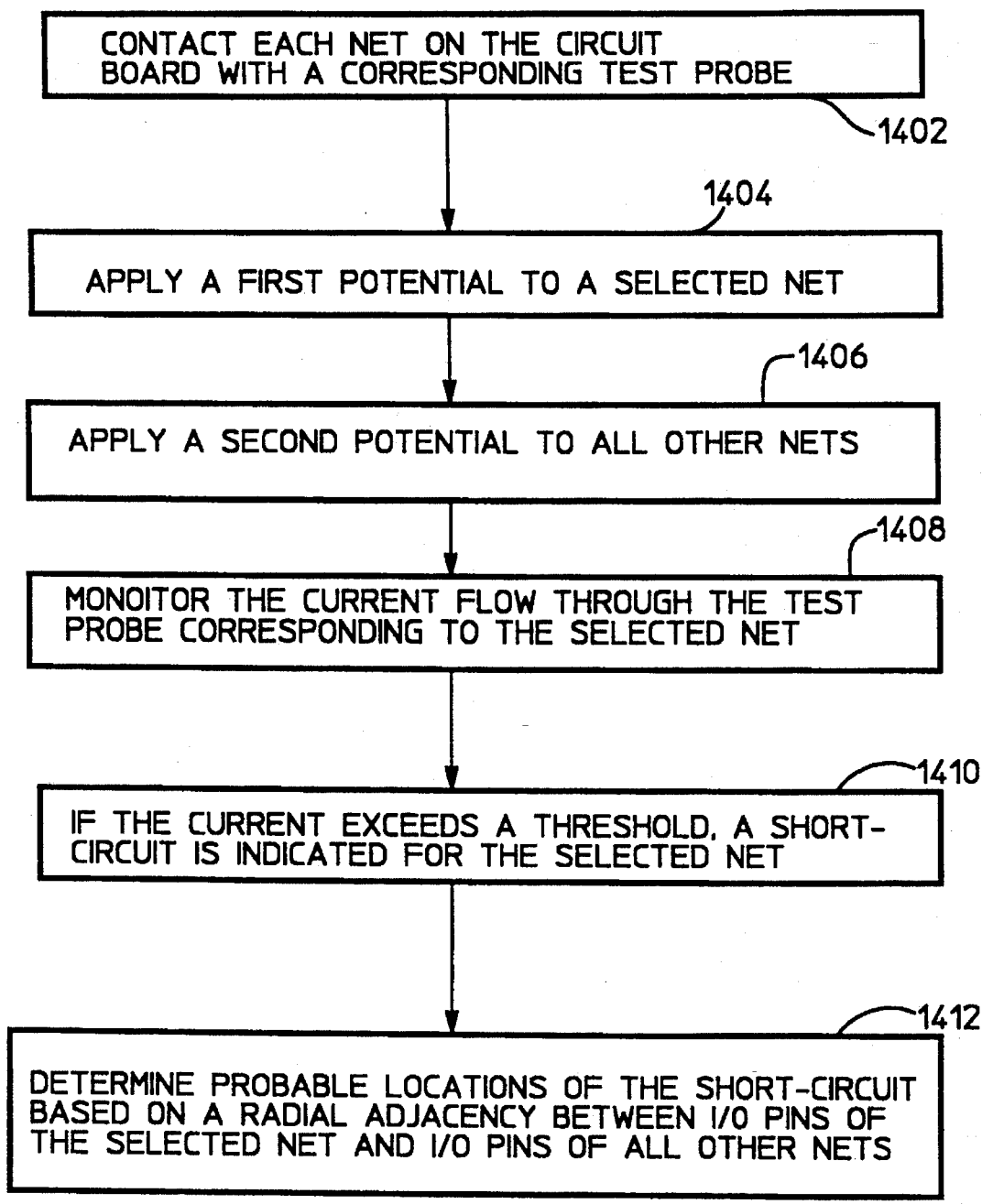
FIG. 14 is a flow illustrating the steps of the invention for performing an unpowered short-circuit test.

The invention, however, may be used to expedite isolating and locating of short-circuits. FIG. 14 illustrates a method of performing an unpowered short-circuit test in accordance with the invention. In a step 1402, each net on the circuit board is contacted with a corresponding test probe. In a step 1404, a first potential (e.g., 0.1 Volts) is applied to a selected net. In a step 1406, a second potential (e.g., ground) is applied to all other nets. In a step 1408, the current flowing through the selected net is monitored. A short circuit condition is indicated at step 1410 if the current in step 1408 exceeds a predetermined threshold. Finally, at step 1412, probable locations of the short-circuit are determined based on a radial adjacency between I/O pins of the selected net and I/O pins of all other nets.

In step 1412, the actual isolation of a short-circuit may be performed using any of the conventional methods, such as those discussed briefly above. However, the isolation process is expedited by looking only to nets which are radially adjacent to the selected net for the short-circuit. For example, if a short-circuit is indicated for $net_1$ in a 100 net circuit, and the radially adjacent nets include $net_5$, $net_8$, $net_{52}$ and $net_{80}$, then only these four radially adjacent nets need be tested to locate the short-circuit. This greatly simplifies the test diagnosis since four rather than 100 nets are searched for the fault.

Moreover, since the radially adjacent pins of the radially adjacent nets are known, probable physical locations for the short-circuit may be automatically presented to the test technician to facilitate location of the fault. For example, if it is determined that $net_{52}$ is short-circuited to $net_1$ and if it is known that pin 1 of $net_{52}$ is radially adjacent to pin 14 of $net_1$, then the physical location (e.g., in x,y coordinates) of $net_{52}$, pin 1, and $net_1$, pin 14, may be presented to the technician as the probable location of the fault. It is contemplated by the inventors that this physical location may be highlighted on an image of the circuit board displayed on a display screen of the ATE. This would allow the test technician to quickly locate and repair the short-circuit fault.

While the invention has been particularly shown and described with reference to a preferred embodiment thereof, it will be understood by those skilled in the art that various changes in form and details may be made therein without departing from the spirit and scope of the invention.

What is claimed is:

1. An automated method for increasing the diagnostic resolution of a boundary-scan interconnect test performed on a circuit, wherein the circuit includes a plurality of integrated circuit chips, each integrated circuit chip having a plurality of I/O pins, the I/O pins making electrical interconnection through a plurality of independent conductive nets, said method comprising:

(1) receiving a list of net signatures generated during execution of a boundary-scan interconnect test;

(2) grouping together nets having identical net signatures into groups of potentially shorted nets;

(3) examining x,y coordinate data contained in a board physical description of the circuit to identify radial adjacencies between I/O pins in the circuit; and (4) for each group of potentially shorted nets, determining which nets are likely short-circuited together based on said radial adjacencies between I/O pins of said nets in said group of potentially shorted nets.

2. The method of claim 1, further comprising a step of:

(5examining the radially adjacent I/O pins to determine the probable location of a short circuit.

3. The method of claim 1, wherein step (3) includes a step of generating an adjacency list that includes for each net in the circuit, the radially adjacent nets.

4. The method of claim 3, wherein step (4) includes checking said adjacency list for each net in said group of potentially shorted nets.

5. An automated method for performing boundary-scan interconnect testing of a circuit, wherein the circuit includes a plurality of integrated circuit chips, each integrated circuit chip having a plurality of I/O pins, the I/O pins making electrical interconnection through a plurality of independent conductive nets, said method comprising:

(1) serially scanning a test vector into the circuit through a scanpath;

(2) broadcasting said test vector from a plurality of output buffers in the circuit over said conductive nets;

(3) capturing said test vector into a plurality of receiving register cells in the circuit;

(4) serially scanning said test vector out of the receiving register cells via said scanpath;

(5) repeating steps (1) through (4) for a plurality of test vectors;

(6) producing a plurality of net signatures from said plurality of captured test vectors;

(7) grouping together nets having identical net signatures into a group of potentially shorted nets;

(8) examining x,y coordinate data contained in a board physical description of the circuit to identity radial adjacencies between I/O pins in the circuit; and (9) for each group of potentially shorted nets, determining which nets are likely short-circuited together based on said radial adjacencies between I/O pins of said nets in said group of potentially shorted nets.

6. A method for generating detection and diagnostic test patterns for boundary-scan interconnect testing of a circuit, wherein the circuit includes a plurality of integrated circuit chips, each integrated circuit chip having a plurality of I/O pins, the I/O pins making electrical interconnection through a plurality of independent conductive nets, said method comprising:.

(1) grouping together conductive nets which have radially adjacent I/O pins;

(2) assigning a unique net identification number to each conductive net in a group according to a high diagnostic test pattern, wherein said unique net identification numbers are duplicated between said groups, and wherein conductive nets which are common to more than one group receive only a single unique net identification number;

(3) assigning a unique group identification number to each group according to a brief test pattern;

(4) appending said group identification number for each group to said net identification number for each conductive net in said each group to form a unique net identifier for each conductive net; and (5) combining said net identifiers to form a matrix, wherein each row of the matrix is one of said net identifiers, and wherein each column of the matrix is a unique test vector available for boundary scan testing.

7. The method of claim 6, wherein said high diagnostic test pattern is a walking bit test pattern.

8. The method of claim 7, wherein said brief test pattern is a counting test pattern.

9. A method for generating detection and diagnostic test patterns for boundary-scan interconnect testing of a circuit, wherein the circuit includes a plurality of integrated circuit chips, each integrated circuit chip having a plurality of I/O pins, the I/O pins making electrical interconnection through a plurality of independent conductive nets, said method comprising:

(1) receiving logical interconnect data defining the logical interconnection between the integrated circuit chips in the circuit;

(2) receiving I/O pin coordinate data for the I/O pins of the integrated circuit chips in the circuit;

(3) receiving a predetermined a radial distance within which improper interconnections between adjacent I/O pins may occur during manufacture of the circuit, said radial distance defining a radial adjacency;

(4) analyzing each I/O pin in a conductive net for radial adjacency to I/O pins of other conductive nets;

(5) grouping together conductive nets which have radially adjacent I/O pins;

(6) assigning a unique net identification number to each conductive net in a group according to a high diagnostic test pattern, wherein said unique net identification numbers are duplicated between said groups, and wherein conductive nets which are common to more than one group receive only a single unique net identification number;

(7) assigning a unique group identification number to each group according to a brief test pattern;

(8) appending said group identification number for each group to said net identification number for each conductive net in said each group to form a unique net identifier for each conductive net; and (9) combining said net identifiers to form a matrix, wherein each row of the matrix is one of said net identifiers, and wherein each column of the matrix is a unique test vector available for boundary scan testing.

10. The method of claim 9, wherein said high diagnostic test pattern is a walking bit test pattern.

11. The method of claim 10, wherein said brief test pattern is a counting test pattern.

12. A method for performing boundary-scan interconnect testing of a circuit, wherein the circuit includes a plurality of integrated circuit chips, each integrated circuit chip having a plurality of I/O pins, the I/O pins making electrical interconnection through a plurality of independent conductive nets, said method comprising:

(1) grouping together conductive nets which have radially adjacent I/O pins;

(2) assigning a unique net identification number to each conductive net in a group according to a high diagnostic test pattern, wherein said unique net identification numbers are duplicated between said groups, and wherein conductive nets which are common to more than one group receive only a single unique net identification number;

(3) assigning a unique group identification number to each group according to a brief test pattern;

(4) appending said group identification number for each group to said net identification number for each conductive net in said each group to form a unique net identifier for each conductive net;

(5) combining said net identifiers to form a matrix, wherein each row of the matrix is one of said net identifiers, and wherein each column of the matrix is a unique test vector available for boundary scan testing;

(6) serially scanning a selected test vector into the circuit through a scanpath;

(7) broadcasting said selected test vector from a plurality of output buffers in the circuit over said conductive nets;

(8) capturing said selected test vector broadcast over said conductive nets into a plurality of receiving register cells in the circuit;

(9) serially scanning said selected test vector captured into said plurality of receiving register cells out of the circuit through said scanpath;

(10) comparing said selected test vector scanned out of the circuit with said selected test vector serially scanned into the circuit; and

(11) repeating steps (6) through (10) for each test vector in said matrix.

13. An automated method for performing an interconnect test on a circuit board having a plurality of integrated circuit chips, each integrated circuit chip having a plurality of I/O pins, the I/O pins making electrical interconnection through a plurality of independent conductive nets, the method comprising:

(1) simultaneously contacting each of the plurality of nets on the circuit board with one of a plurality of test probes;

(2) applying a first potential to a selected one of the plurality of nets via a corresponding test probe;

(3) applying a second potential to all remaining ones of the plurality of nets via said plurality of test probes;

(4) monitoring a current flow through said corresponding test probe;

(5) if said current flow exceeds a threshold, indicating a short-circuit for said selected one of the plurality of nets;

(6) examining x,y coordinate data contained in a board physical description of the circuit to identify radial adjacencies between I/O pins in the circuit: and (7) determining probable locations of said short-circuit based on said radial adjacencies between I/O pins of said selected one of the plurality of nets and I/O pins of all remaining ones of the plurality of nets.

14. The method of claim 13, wherein said first potential is a voltage greater than zero volts and less than a voltage which will turn on semiconductor junctions within the plurality of integrated circuit chips on the circuit board, and wherein said second potential is zero volts.

15. The method of claim 13, wherein step (6) includes a step of generating an adjacency list that includes for each net in the circuit, the radially adjacent nets.

16. The method of claim 15, wherein step (7) of determining probable locations of said short-circuit comprises the steps of:

(a) checking said adjacency list for said selected one of the plurality of nets;

(b) identifying, from said adjacency list, all radially adjacent I/O pins, wherein a radially adjacent I/O pin is an I/O pin of a remaining one of the plurality of nets which is radially adjacent to an I/O pin of said selected one of the plurality of nets; and (c) indicating a physical location of a radially adjacent I/O pin as a probable location of said short-circuit.

17. An automated method for facilitating location of a short-circuit fault between a plurality of nets on a circuit board after the presence of the short-circuit fault has been indicated by a test, the method comprising the steps of:

(a) examining x,y coordinate data contained in a physical description of the circuit board to generate an adjacency list that identifies radial adjacencies between I/O pins on the circuit board;

(b) identifying, from said adjacency list, all radially adjacent I/O pins of said plurality of nets, wherein a radially adjacent I/O pin is an I/O pin of one of the plurality of nets which is radially adjacent to an I/O pin of another of the plurality of nets; and (b) indicating a physical location of a radially adjacent I/O pin as a probable location of said short-circuit.

18. An automated method for increasing the diagnostic resolution of a boundary-scan interconnect test performed on a circuit board, wherein the circuit board includes a plurality of conductive nets, each of the plurality of conductive nets connecting a plurality of circuit devices at physical connection points defined by x,y coordinates, the method comprising the steps of:

(1) receiving a list of nets identified by the boundary-scan interconnect test as a group of potentially shorted nets, wherein each of the nets in said group of potentially shorted nets has identical net signatures;

(2) determining whether the x,y coordinates of any one of the physical connection points on a single net in said group of potentially shorted nets is within a defined radial proximity of the x,y coordinates of any one of the physical connection points on any of the remaining nets in said group of potentionally shorted nets; and (3) grouping together those nets in said group of potentionally shorted nets that have physical connection points within said defined radial proximity.

19. The method of claim 18, further comprising the step of:

(4) providing a listing of I/O pin locations, corresponding to the x,y coordinates of the physical connection points that are within said defined radial proximity, to assist a technician in physically locating short-circuit faults.

20. An automated method for facilitating location of a short-circuit fault between a suspect group of nets on a circuit board after the presence of the short-circuit fault has been indicated by a test, wherein the circuit board includes a plurality of conductive nets, each of the plurality of conductive nets connecting a plurality of circuit devices at physical connection points defined by x,y coordinates, the method comprising the steps of:

(1) for each net in the suspect group of nets, determining a list of x,y coordinates that includes the x,y coordinates of all physical connection points that are within a defined radial proximity to a physical connection point on another net in the suspect group of nets; and (2) providing a listing of I/O pin locations, corresponding to said list of x,y coordinates, to assist a technician in physically locating short-circuit faults.

* * * * *

UNITED STATES PATENT AND TRADEMARK OFFICE
CERTIFICATE OF CORRECTION

PATENT NO. : 5,513,188
DATED : 04/30/96
INVENTOR(S) : Kenneth P. Parker, et al.

It is certified that error appears in the above-identified patent and that said Letters Patent is hereby corrected as shown below:

Column 5, line 31, "flames" should read --frames--;

Column 15, line 9, "perforating" should read -- performing--;

Column 16, line 4, "(5examining" should read -- (5) examining--;

Column 16, line 35, "identity" should read -- identify--;

Column 18, line 42, "adjacencies between I/O pins in the circuit: and" should read -- adjacencies between I/O pins in the circuit; and--.

Signed and Sealed this

Nineteenth Day of May, 1998

*Attest:*

BRUCE LEHMAN

*Attesting Officer*  Commissioner of Patents and Trademarks